United States Patent [19]

Kavaya

[11] Patent Number: 4,509,132
[45] Date of Patent: Apr. 2, 1985

[54] METHOD AND APPARATUS FOR TRANSFER FUNCTION SIMULATOR FOR TESTING COMPLEX SYSTEMS

[75] Inventor: Michael J. Kavaya, San Gabriel, Calif.

[73] Assignee: The United States of America as represented by the Administrator of the National Aeronautics and Space Administration, Washington, D.C.

[21] Appl. No.: 387,647

[22] Filed: Jun. 11, 1982

[51] Int. Cl.³ ............ G06G 7/48; G06F 15/46; H01S 3/13
[52] U.S. Cl. ............ 364/571; 364/578; 372/32
[58] Field of Search ............ 364/550, 551, 553, 571, 364/578; 371/23; 372/20, 30, 32

[56] References Cited

U.S. PATENT DOCUMENTS

| | | | |
|---|---|---|---|
| 2,935,670 | 5/1960 | Gorrie | 364/551 |
| 3,177,347 | 4/1965 | Cowley | 364/553 |
| 3,240,919 | 3/1966 | Schultz | 364/553 |
| 3,250,898 | 5/1966 | Vasu | 364/553 |
| 3,453,534 | 7/1969 | Post | 364/553 |
| 3,505,512 | 4/1970 | Fricke, Jr. et al. | 364/801 |
| 4,099,240 | 7/1978 | Rode et al. | 364/571 |
| 4,272,825 | 6/1981 | Smithline et al. | 364/571 |
| 4,286,318 | 8/1981 | Immink et al. | 364/553 |
| 4,394,744 | 7/1983 | Wrench, Jr. | 364/553 |
| 4,395,752 | 7/1983 | Hirosawa | 364/553 |
| 4,401,192 | 8/1983 | Trosky et al. | 364/551 |

OTHER PUBLICATIONS

*Transfer-Function Tracking and Adaptive Control Systems,* Weygandt et al., May 1961, IRE Transactions on Automatic Control, pp. 162–166.

Primary Examiner—Felix D. Gruber
Attorney, Agent, or Firm—Paul F. McCaul; John R. Manning; Thomas H. Jones

[57] ABSTRACT

A method and apparatus for testing the operation of a complex stabilization circuit in a closed-loop system (12, 38) is comprised of a programmed analog (60–72) or digital (80–86) computing system for implementing the transfer function of a load (12), thereby providing a predictable load. The digital computing system employs a table stored in a microprocessor (84) in which precomputed values of the load transfer function are stored for values of input signal from the stabilization circuit (38) over the range of interest. This technique may be used not only for isolating faults in the stabilization circuit (38), but also for analyzing a fault in a faulty load by so varying parameters of the computing system as to simulate operation of the actual load with the fault.

7 Claims, 6 Drawing Figures

4,509,132

METHOD AND APPARATUS FOR TRANSFER FUNCTION SIMULATOR FOR TESTING COMPLEX SYSTEMS

ORIGIN OF INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

FIELD OF THE INVENTION

This invention relates to a method and apparatus for testing complex closed-loop systems by simulating the transfer function of a load in the system.

BACKGROUND OF THE INVENTION

While designing complex electronic systems, it is convenient and sometimes necessary to provide an adaptive load for testing. An example of such a complex electronic system is described by Michael J. Kavaya, Robert T. Menzies and Uri P. Oppenheim in a paper titled "Optogalvanic Stabilization and Offset Turning of a Carbon Dioxide Waveguide Laser," published in the IEEE Journal of Quantum Electronics, Vol. QE-18, No. 1, January, 1982 at pages 19-21. That paper describes a feedback loop employing the change in the discharge impedance of a $CO_2$ laser, as its output power is varied, to stabilize the frequency of the laser. A zero offset feature in the feedback loop allows continuous tuning of the stabilized frequency over a 300-400 MHz range.

There are, of course, many closed-loop stabilization techniques for stabilizing the output frequency of a laser, such as a spectrophone stabilized laser, with line center offset, disclosed in U.S. Pat. No. 4,434,490, filed Mar. 31, 1982. It should therefore be understood that the method and apparatus for simulating a transfer function of a load in testing complex systems disclosed herein is not limited to laser frequency control systems, although the system of that application will be used as an example.

SUMMARY OF THE INVENTION

In accordance with the present invention, the transfer function of a load to be stabilized by a feedback signal in a closed loop with a stabilization circuit is simulated while testing the operation of the stabilization circuit in the closed-loop system to verify its proper operation, and the limits of its proper operation may be determined by varying the parameters of the simulated load.

The simulated load may be devised as an analog or digital computing means. In the latter case, software establishes the transfer function of the simulated load, which may therefore be more flexible for more complex loads. An equation is first written for the voltage output of the actual load as a function of an input voltage (output voltage of the feedback loop under test) and any reference voltages that may be applied. Digital computing means are then programmed, such as with a look-up table, to provide an output voltage, $V_{OUT}$, for every value of input voltage, $V_{IN}$ from the stabilization circuit. The input voltage from the stabilization circuit is converted to digital form and entered into the digital computing means for generation of an output voltage value as the transfer function of the load being simulated. The generated output voltage value is converted from digital to analog form and applied to the stabilization circuit. This digital form of implementation is universally applicable to testing any closed loop system for which the transfer function may be predetermined over a range of interest.

The analog form of implementation is also based upon the known transfer function of the particular actual load expressed by an equation. Analog computing means are then programmed to compute the output voltage of the test load using any reference voltages necessary in the computation. This output voltage is then applied to the stabilization circuit in the feedback loop of the complex system under test.

The novel features that are considered characteristic of this invention are set forth with particularity in the appended claims. The invention will best be understood from the following example described with reference to the accompanying drawings.

DESCRIPTION OF PREFERRED EMBODIMENTS

In order to present a complete description of the invention in a specific embodiment, the spectrophone stabilized laser with line center offset frequency control disclosed in the aforementioned application will first be described.

Figure 1:
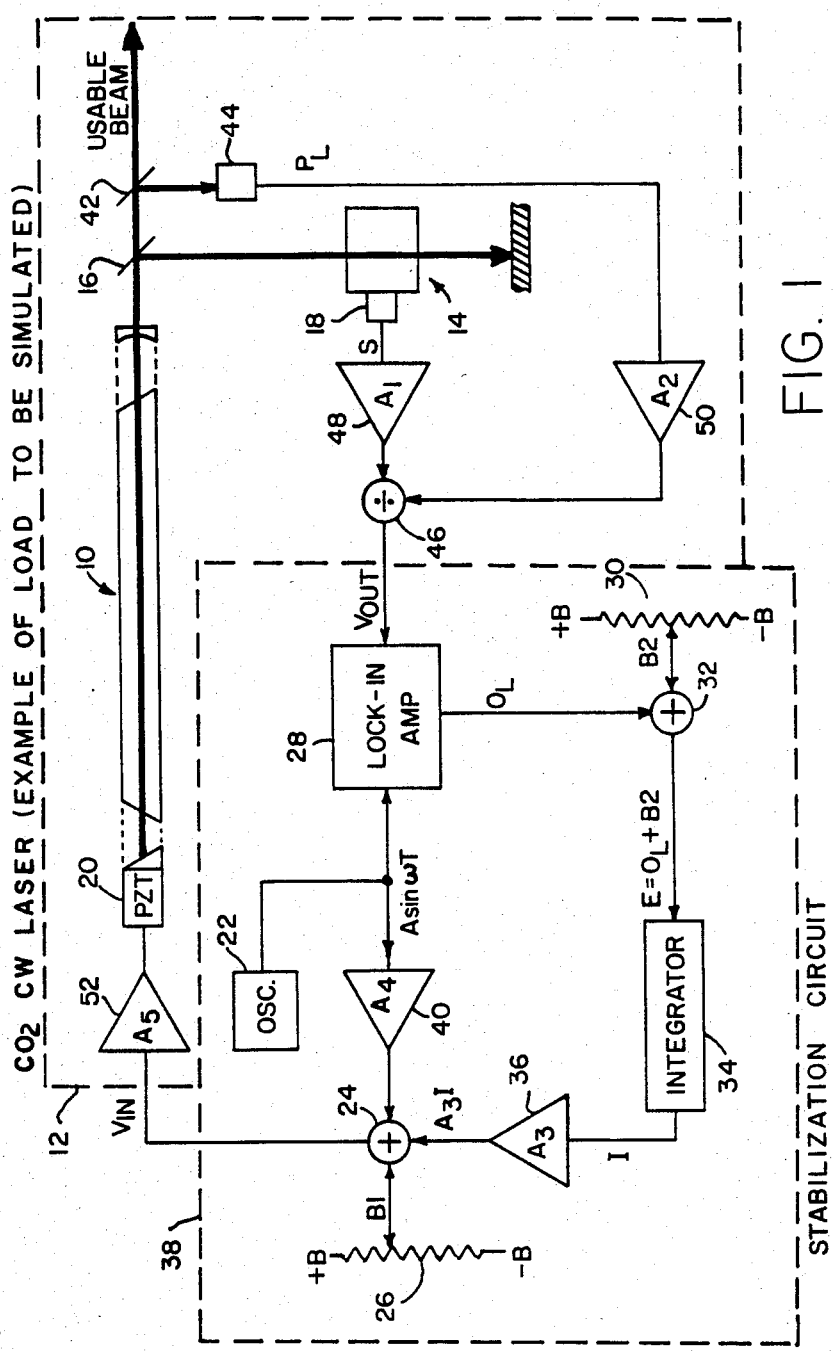
FIG. 1 is a schematic drawing of a spectrophone stabilized laser with line center offset frequency control.

Referring to FIG. 1 of the drawings, a $CO_2$ continuous wave (cw) laser 10 is shown as an example of an actual load 12 to be simulated in accordance with the present invention. A portion of the laser beam is directed through a spectrophone 14 by a beam splitter 16. The spectrophone is typically filled at a low pressure with the same gas as the laser. The gas pressure in the spectrophone determines the width of its absorption line which is a factor in the tuning control; the lower the pressure, the narrower the line. The width of the line may be defined through the parameter $\gamma_L$, which is the half-width at half maximum (HWHM), the frequency spread from peak center to a point at one half the amplitude of the peak.

If the light beam through the spectrophone were modulated on and off as by a chopper, the electrical signal from a microphone 18 of the spectrophone 14 would be proportional to the height of the original absorption curve. However, in accordance with the invention, a cw laser is modulated by a sinusoidal dither voltage applied to a piezoelectric transducer 20, such as a lead zirconate-lead titanate (PZT) ceramic transducer, from an oscillator 22 applied through an adder 24 which sums two other voltages, one from a potentiometer 26 providing a dc bias voltage B1, and the other a correction signal from a lock-in amplifier 28 superimposed on a second dc bias voltage B2 from a potentiometer 30 through an adder 32 and integrated by an electronic circuit 34. The integrator is coupled to the adder by an amplifier 36.

The voltage B1 is an offset voltage which is adjusted to tune the laser to the desired operating region within the spectral linewidth of the gas. The oscillator provides the sinusoidal dither signal which is amplified by a circuit 40, the gain of which is adjustable, and applied to the PZT. This sinusoidal voltage dithers the length of the laser cavity ever so slightly, which in turn dithers the output of the laser correspondingly in a periodic fashion. In effect, the frequency is being dithered as shown along the absorption curve of graph A in FIG. 2.

Figure 2:
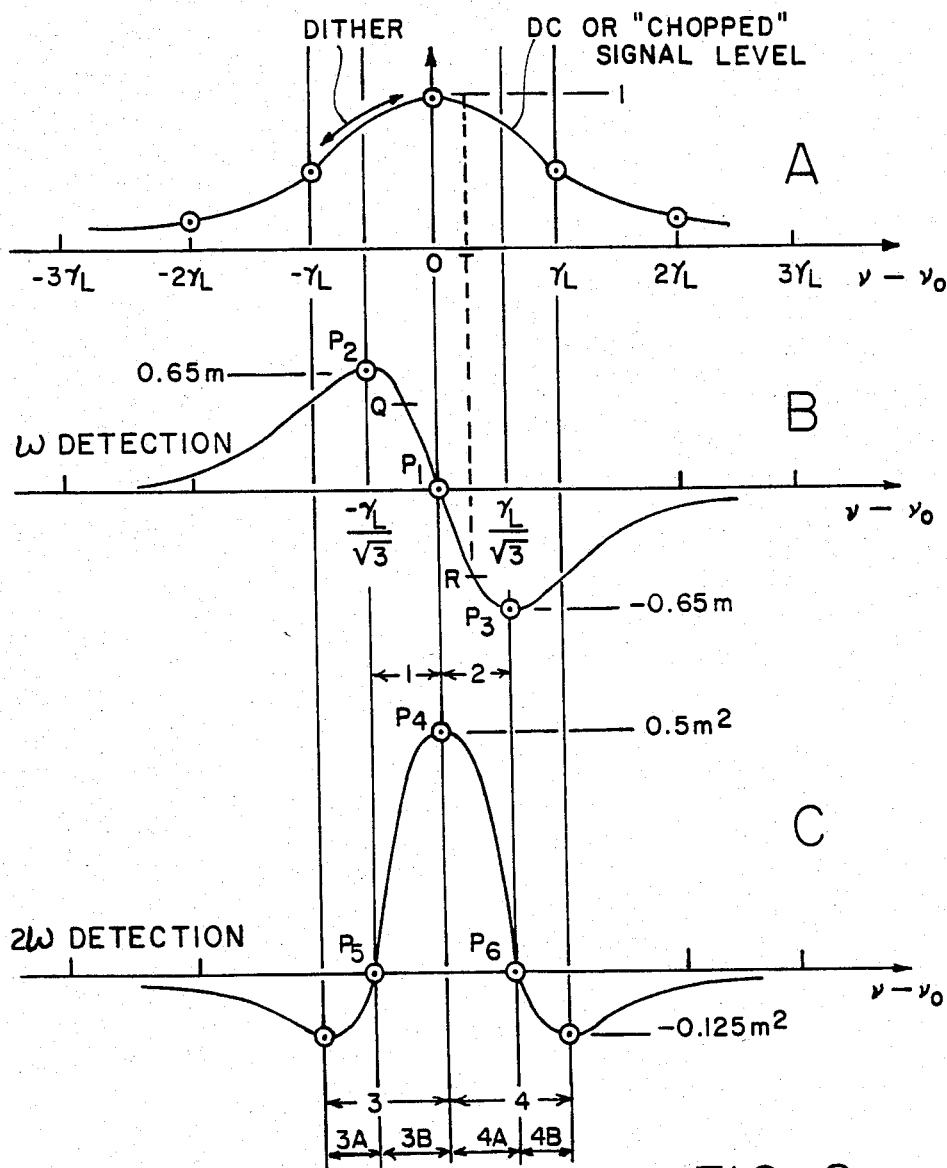
FIG. 2 illustrates operation of the spectrophone stabilized laser of FIG. 1.

If the dithered spectrophone signal is fed into the lock-in amplifier and detected at a frequency $\omega$, which is the original dither frequency, then the correction signal output $O_L$ will be proportional to the first derivative of the absorption curve, as shown in graph B of FIG. 2. The output signal, $O_L$, in this case will be zero at the center, positive to the left, and negative to the right. If desired, graphs B and C can be inverted with respect to the horizontal axis with amplifiers. If detection is done at frequency $2\omega$, the lock-in detection occurs at twice the dither frequency; the output signal $O_L$ is proportional to the negative of the second derivative of the curve of graph A, or the negative of the derivative of the first derivative in graph B, as shown in graph C.

The first derivative has a zero-crossing at line center (point $P_1$) and two maxima at points $P_2$ and $P_3$. The second derivative curve has a maximum at line center point $P_4$ and two zero crossings at points $P_5$ and $P_6$; the zero crossings are a certain distance from center corresponding to the maxima of the first derivative which has only one zero crossing that is always on line center.

In previous stabilization circuits, the output of the lock-in amplifier was integrated directly, and the integrated signal was added into the PZT voltage, creating a compensation voltage at a stable operating point. The stable operating point is where the error signal E (FIG. 1) is zero. Therefore, in detecting the dither signal using the first derivative, the only stable operating point is at $P_1$ (graph B) where the output of the lock-in amplifier, $O_L$, is zero. If the second derivative technique is used, the only two stable operating points are at $P_5$ and $P_6$ (graph C) where the output of the lock-in amplifier is zero.

In the stabilization circuit 38, the zero-crossing points $P_1$, $P_5$ and $P_6$ are not the only frequencies at which the system can be stabilized. If it is desired to stabilize at any given frequency (point on the detection curve of graph A), a bias voltage B2 (which is either positive or negative) is generated using potentiometer 30 and added to the output of the lock-in amplifier 28 before integrating it as an error signal, E.

The condition for stability is still E=0, but now for E to be zero, it is required that the lock-in amplifier output be equal to $-B2$ so that the sum $(O_L+B2)$ be zero If it is thus required that the lock-in amplifier output be equal to $-B2$, and if B2 is set properly, it can be seen that on the first derivative curve of graph B, the stabilized frequency can be ranged anywhere between the positive and negative peaks $P_2$ and $P_3$ with the adjustment of B2. If B2 is set at a level Q shown in FIG. 2, graph B, then the lock-in output has to be at level R, the negative of B2, which means that the laser operating frequency will be at the operating point T (graph A) and the laser will be stabilized there.

In the second derivative technique, the initial operating point may be, for example, at point $P_6$. The operating point will move either up or down the curve of graph C (FIG. 2) by adjusting voltage B2, since again the stability condition is that $O_L = -B2$.

The following is a summary of the operating regions in the first derivative technique.

| INTERVALS OF STABLE FREQUENCY OFFSET |
| --- |
| $\omega$Detection (1st Derivative) |
| Lock-In Phase = $\emptyset$ = 0°    (Assume laser frequency increases as PZT voltage increases; and $A_3$, $A_4$, $A_5 > 0$) |
| POINT P1 FOR B2 = 0 (as in the prior art) |
| INTERVAL (1) FOR B2 < 0 |
| INTERVAL (2) FOR B2 > 0 |
| If the gain $A_3$ of amplifier 36 (FIG. 1) is < 0, add 180° to $\emptyset$. |

In this first derivative ($\omega$ detection) method, the lock-in amplifier would be set to 0 degrees (in phase) because the signal it detects at $\omega$ would be in phase with the oscillator output A Sin $\omega$T, and stabilization in interval (1) if voltage B2 is less than 0, because that means the lock-in voltage is greater than zero, and stabilization in interval (2) if voltage B2 is greater than zero, because lock-in must be the opposite of it, as noted above and shown in FIG. 2 under the graph B.

The following is a summary of the operating regions in the second derivative technique:

| INTERVALS OF STABLE FREQUENCY OFFSET |
| --- |
| $2\omega$ Detection (2nd Derivative) |
| Lock-In Phase = $\emptyset$ = 90°    (same assumptions as in first derivative case above) |
| INTERVAL (4) |
| Subinterval (4A) if B2 > 0 |
| Subinterval (4B) if B2 < 0 |
| POINT P6 FOR B2 = 0 (as in the prior art) |
| Lock-In Phase = $\emptyset$ = 270° |
| INTERVAL (3) |
| Subinterval (3A) if B2 > 0 |
| Subinterval (3B) if B2 < 0 |
| POINT P5 FOR B2 = 0 (as in the prior art) |

In the second derivative technique there are four subintervals 3A, 3B, 4A, 4B of stabilization. The offset voltage B2 can be + or −, which means that the operating point must be below or above the horizontal axis, respectively, but also in interval (3), the lock-in amplifier signal is rising in amplitude with increasing frequency and, in interval (4), the signal is falling in amplitude with increasing frequency.

Not only does it matter in the second derivative case whether you are above or below the horizontal axis, which determines whether the offset voltage is − or +, but it also matters whether the signal is increasing or decreasing with increasing frequency; therefore, another parameter to consider is the phase of the lock-in amplifier. The $2\omega$ component of the spectrophone signal into the lock-in amplifier is 90° out of phase with the oscillator output; therefore the lock-in amplifier is at a 90° setting initially to stabilize in subintervals 4A and 4B. Over this region the slope is the same as in the first derivative case, falling with increasing frequency. If the lock-in amplifier phase is changed to 270°, stabilization is possible in subintervals 3A and 3B where the slope is opposite that of the first derivative case.

Another important feature of the stabilization circuit 38 is that the amplitude of the dither will determine how broad the detected curves are. As the dither amplitude is increased, the curves of graphs B and C in FIG. 2 get broader. What that means is that if it is desired to lock a little bit further out from line center on the frequency axis, the dithering amplitude can be increased to broaden the detected signal curves of graphs B and C. It is then possible to lock (stabilize) at that frequency.

The spectrophone signal into the lock-in amplifier is proportional to the power of the laser. A technique for making that signal independent of the laser power utilizes another beam splitter 42 directing a portion of the laser beam into a power detector 44, obtaining the voltage signal $P_L$ which is proportional to laser power, and then dividing the spectrophone signal S by that voltage signal in an analog dividing circuit 46, so that the output signal, $V_{OUT}$, from the actual load is independent of the laser power. Thus, because the spectrophone signal S is proportional to laser power, after dividing by the laser power, the dependence is removed so that the dependence of the absorption curve, rather than the dependence of the output power of the laser with offset, is available in the output signal $V_{OUT}=A_1S/A_2P_L$ into the lock-in amplifier 28, where $A_1$ and $A_2$ are fixed (or adjusted) gain factors of amplifiers 48 and 50.

It should be noted that when the laser is locked and stabilized at some point off line center, the amount of offset from center can be adjusted by three separate parameters: the voltage B2 offset; the amplitude of the dither, because that will widen or narrow the detection curve; and the pressure of the gas in the spectrophone, because that too will widen or narrow the absorption curve, thereby adjusting the amount of offset correspondingly. In practice, it will not be convenient to adjust pressure, once the instrument is set up for an experiment. Instead the pressure will be selected for some nominal breadth of the absorption curve. The breadth of the detection curve can then be modified during operation by adjusting the amplitude of the dither added by adjustment of the gain of the amplifier 40. Note that coupling amplifiers 40, 48, 50 and 52, like amplifier 36, each have adjustable gain which may be unity, or may be greater or less than unity, and that amplifiers 48 and 50 may have their relative gains adjusted to effectively set the range of the signal input to the lock-in amplifier.

It will also be noted that the signal obtained with the first derivative technique is smaller than would be obtained with a light chopper; the signal obtained with the second derivative technique is smaller yet. This assumes that m<1 where we define the peak-to-peak amplitude of the dither signal in units of laser frequency as $2m\gamma_L$. These facts emphasize the importance of the use of a spectrophone as a sensitive transducer which makes these techniques possible. Also, the ability to choose the width of the absorption line through the choice of the gas pressure in the spectrophone, allows greater flexibility in the overall stability or "tightness" of the feedback loop. The technique is applicable to all three possible absorption lineshapes of the spectrophone gas fill: Lorentzian, Doppler, or Voigt. The modulation of an absorption lineshape for the first two possibilities are described in the aforesaid patent application.

THEORY OF DERIVATIVE DETECTION

Consider a general experimental configuration where the response or signal is affected by some experimental parameter and the shape of this effect is the Lorentzian lineshape as in the $CO_2$ cw laser of FIG. 1. Using frequency, $\nu$, as the experimental parameter, although it may be any parameter (e.g. voltage, magnetic field, etc.), the specific equations of the Lorentzian lineshape, its first three derivatives and their maxima are given in Table 1 shown in Appendix A.

Assuming a small sinusoidal dither, at a modulation frequency of $\omega$, of the experimental parameter $\nu$, the resultant frequency is given by:

$$\nu = \nu_0 + \nu_1 + m\gamma_L \sin \omega t, \tag{1}$$

where $\nu_0$ is the Lorentzian linecenter frequency, $\nu_1$ is the offset frequency from linecenter, $\gamma_L$ is the half-width at half-maximum (HWHM), and m is the modulation coefficient. The peak-to-peak modulation is $2m\gamma_L$. Inserting equation (1) into the Lorentzian equation yields the following equation:

$$\sigma(\nu_1,m,t) = \frac{S}{\pi} \frac{\gamma_L}{(\nu_1 + m\gamma_L\sin\omega t)^2 + \gamma_L^2} = \tag{2}$$

$$\frac{S\gamma_L}{\pi(\nu_1^2 + \gamma_L^2)} \frac{1}{1 + \left[\frac{2\nu_1 m\gamma_L\sin\omega t + (m\gamma_L)^2\sin^2\omega t}{\nu_1^2 + \gamma_L^2}\right]}.$$

for m<1, equation (2) is expanded using:

$$\frac{1}{1+x} = 1 - x + x^2 - x^3 + x^4 - \ldots (x^2 < 1), \tag{3}$$

to obtain $$\sigma(\nu_1,m,t) = \frac{S\gamma_L}{\pi(\nu_1^2 + \gamma_L^2)} \Bigg\{ 1 + m\gamma_L\left[\frac{-2\nu_1\sin\omega t}{\nu_1^2 + \gamma_L^2}\right] + \tag{4}$$

$$(m\gamma_L)^2\left[\frac{-1}{2(\nu_1^2 + \gamma_L^2)} + \frac{2\nu_1^2}{(\nu_1^2 + \gamma_L^2)^2} + \frac{\cos 2\omega t}{2(\nu_1^2 + \gamma_L^2)} - \right.$$

$$\left. \frac{2\nu_1^2\cos 2\omega t}{(\nu_1^2 + \gamma_L^2)^2}\right] + (m\gamma_L)^3\left[\frac{3\nu_1\sin\omega t}{(\nu_1^2 + \gamma_L^2)^2} - \frac{6\nu_1^3\sin\omega t}{(\nu_1^2 + \gamma_L^2)^3} - \right.$$

$$\left. \frac{\nu_1\sin 3\omega t}{(\nu_1^2 + \gamma_L^2)^2} + \frac{2\nu_1^3\sin 3\omega t}{(\nu_1^2 + \gamma_L^2)^3}\right] + 0(m^4) \Bigg\}.$$

Equation (4) reveals that the signal consists of a dc component, a component at the modulation frequency $\omega$, and components at all the harmonics of $\omega$. The odd harmonics of $\omega$, including $\omega$ itself, are in-phase with the initial dither signal, while the even harmonics are 90° out of phase. For values of m much less than 1, the high powers of m may be neglected. The signals at $\omega$ and $2\omega$ become:

$$\sigma^\omega = \frac{-2S\gamma_L}{\pi} \frac{\nu_1}{[\nu_1^2 + \gamma_L^2]^2} m\gamma_L \sin\omega t + O(m^3) \quad (5)$$

and $$\sigma^{2\omega} = \frac{2S\gamma_L}{\pi} \frac{(3\nu_1^2 - \gamma_L^2)}{[\nu_1^2 + \gamma_L^2]^3} \frac{(-m^2\gamma_L^2\cos2\omega t)}{4} + O(m^4) \quad (6)$$

If the sinusoidal amplitudes of equations (5) and (6) are compared with the entries of Table 1 for $\nu - \nu_0 = \nu_1$, it is evident that:

$$\frac{\text{in-phase signal at } \omega}{\text{first derivative}} = m\gamma_L, \quad (7)$$

and $$\frac{\text{quadrature signal at } 2\omega}{\text{second derivative}} = \frac{-m^2\gamma_L^2}{4}. \quad (8)$$

Thus the $\omega$ signal is proportional to the first derivative and to $m\gamma_L$ and the $2\omega$ signal is proportional to the second derivative and to $(m\gamma_L)^2$. Each signal may be increased by increasing m. However, this will decrease the resolution in $\nu_1$ and eventually violate the assumption $m << 1$.

Equations (5) through (8) are approximations based on small dither amplitudes compared to the HWHM of the Lorentzian curve. However, the exact expression in equation (2) can be used with a Fourier series analysis to find the Fourier coefficients of the $\omega$ and $2\omega$ signal components. First, the offset frequency is expressed in terms of the HWHM by setting $\nu_1 = \beta\gamma_L$. The desired coefficients are then found to be:

$$b_1 = \frac{2S}{T\pi\gamma_L} \int_{-\frac{T}{2}}^{\frac{T}{2}} \frac{\sin(\omega t)}{1 + (\beta + m\sin\omega t)^2} dt, \quad (9)$$

$$a_2 = \frac{2S}{T\pi\gamma_L} \int_{-\frac{T}{2}}^{\frac{T}{2}} \frac{\cos(2\omega t)}{1 + (\beta + m\sin\omega t)^2} dt. \quad (10)$$

Figure 3:
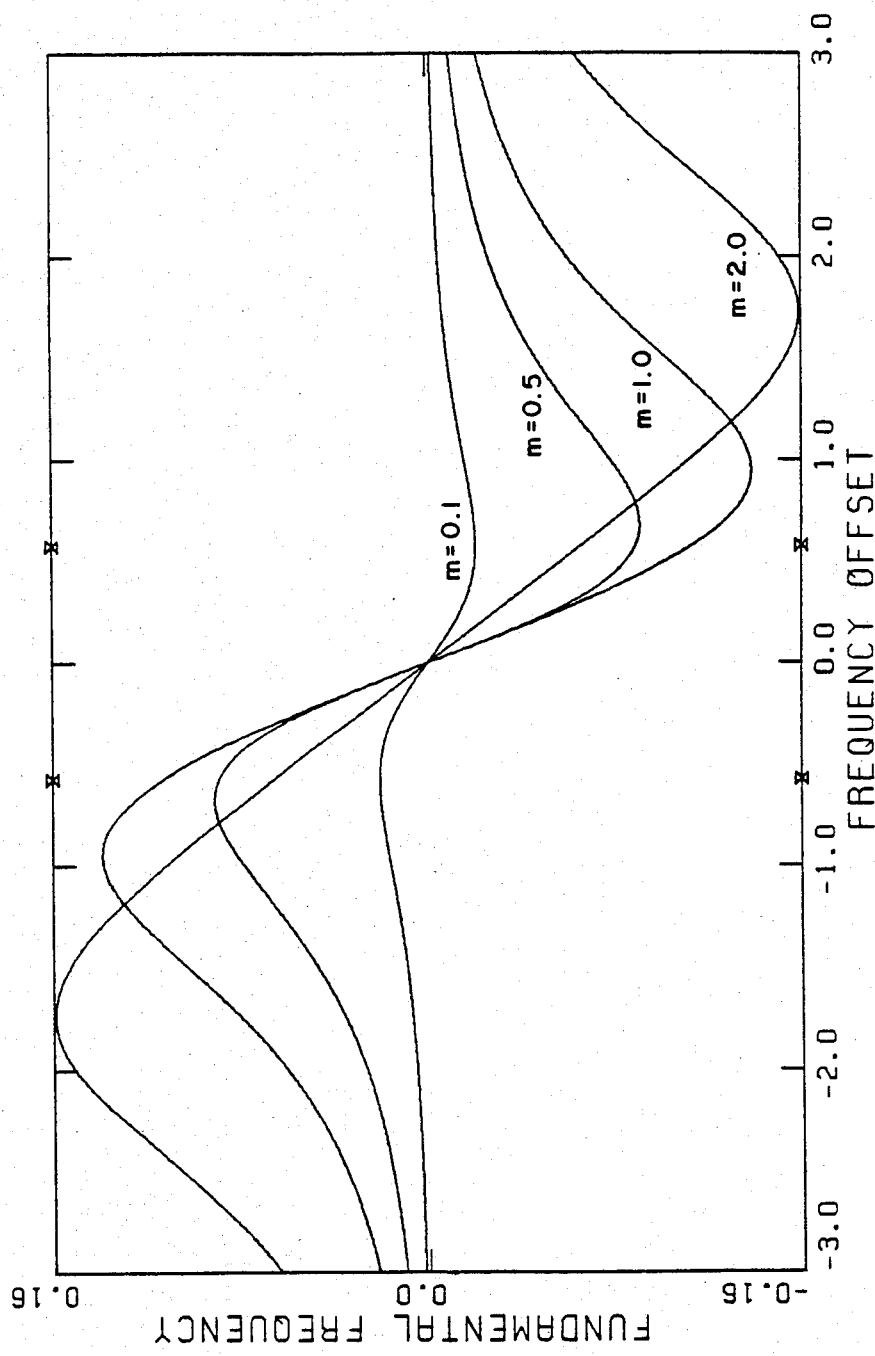
FIG. 3 shows a plot of the first derivative of the Lorentzian line response of a spectrophone for various values of modulating amplitude.
Figure 4:
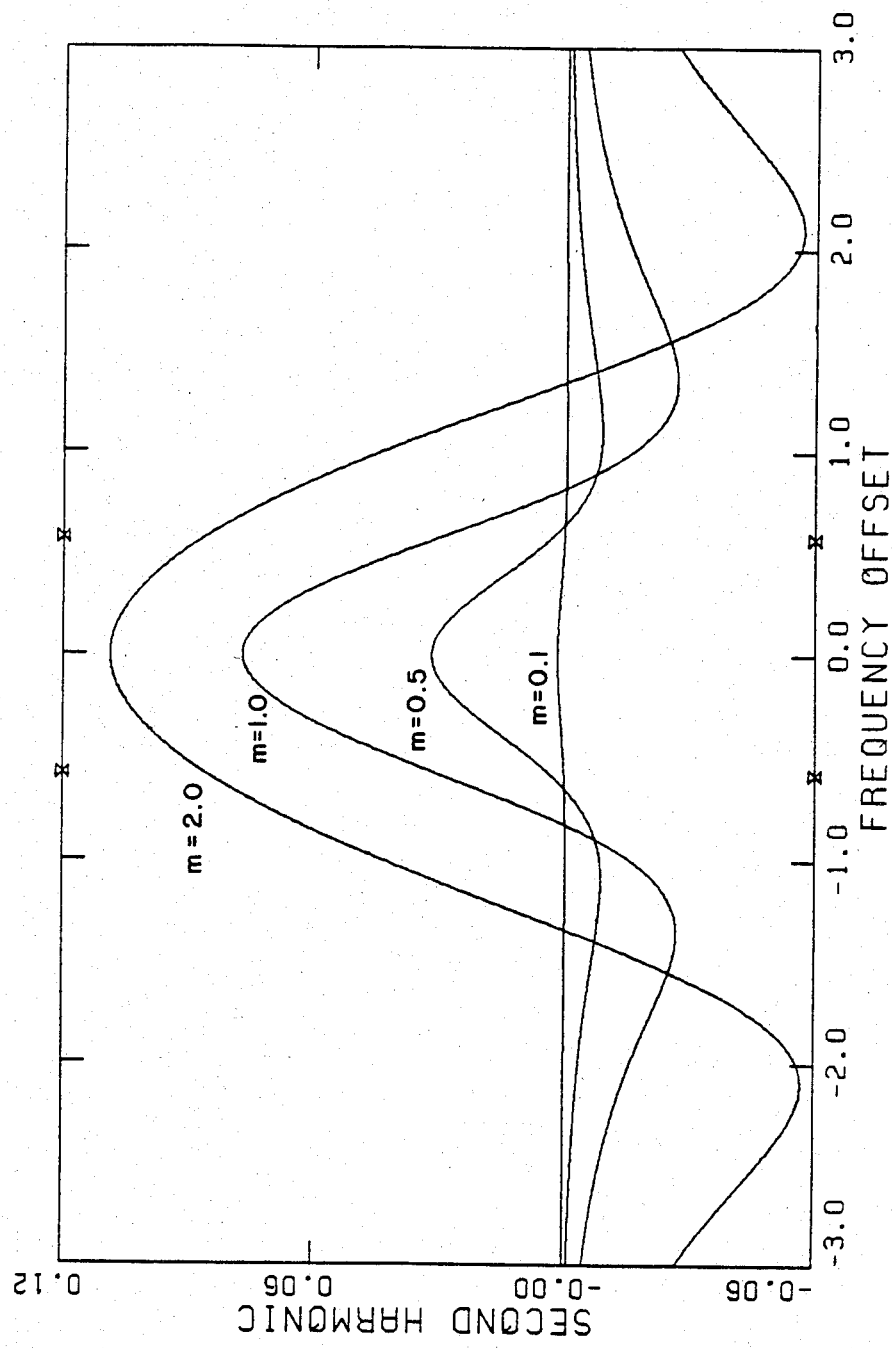
FIG. 4 shows a plot of the second derivative of the Lorentzian line response of a spectrophone for various values of modulation amplitude.

The integrals can be evaluated numerically. FIGS. 3 and 4 show plots of $\gamma_L b_1/S$ and $\gamma_L a_2/S$ vs. $\beta$ for various values of the modulation coefficient m. The specific values of m are 0.1, 0.5, 1.0, and 2.0, where m=2.0 corresponds to the largest signal, etc. In addition to an increasing signal with larger values of m, it is evident that the curves widen in the horizontal or frequency offset dimension. (An analysis for large values of m shows that the $\omega$ signal is maximum when m=2.2 for both the Lorentzian and Doppler line shapes.) From Table 1, it is seen that the peak values of the first derivative (zero-crossings of the second derivative) occur at $(\nu - \nu_0) = \pm\gamma_L/\sqrt{3} = \pm 0.577\gamma_L$. These frequency offset coordinates are marked on the figures. Thus first or second derivative data should be used to estimate $\gamma_L$ only for very small values of m, the modulation coefficient.

If large values of m are required because of signal-to-noise considerations, it may still be possible to derive $\gamma_L$ by measuring the derivative signals versus frequency offset for two or more values of m.

From the foregoing, it can be concluded that the Lorentzian lineshape for the actual load of FIG. 1 is $$\sigma_L(\nu) = \frac{S}{\pi} \frac{\gamma_L}{(\nu - \nu_0)^2 + \gamma_L^2} \quad (11)$$

The essence of the present invention is in the method and means for providing an adaptive load for testing complex electronic closed-loop systems, such as a laser and frequency control circuit wherein the actual load is replaced by a transfer function simulator in which the transfer functions of the actual load are generated, using either analog or digital techniques. This simulation enables feedback control loops under development to work into an adaptive load of known parameter values, instead of into an actual load that may itself have faults, making the loop difficult to analyze.

Although the essence of the invention will now be described with reference to the $CO_2$ cw laser of FIG. 1 providing a spectrophone feedback signal as an example of an actual load for the particular stabilization circuit shown, it is recognized that there are many closed-loop stabilization circuits, either in use or proposed, for stabilizing the output frequency of a laser, and that the present invention has utility in the development of other complex feedback control systems. Consequently, it is intended that the claims be interpreted to cover this and other closed-loop stabilization systems in general.

Figure 5:
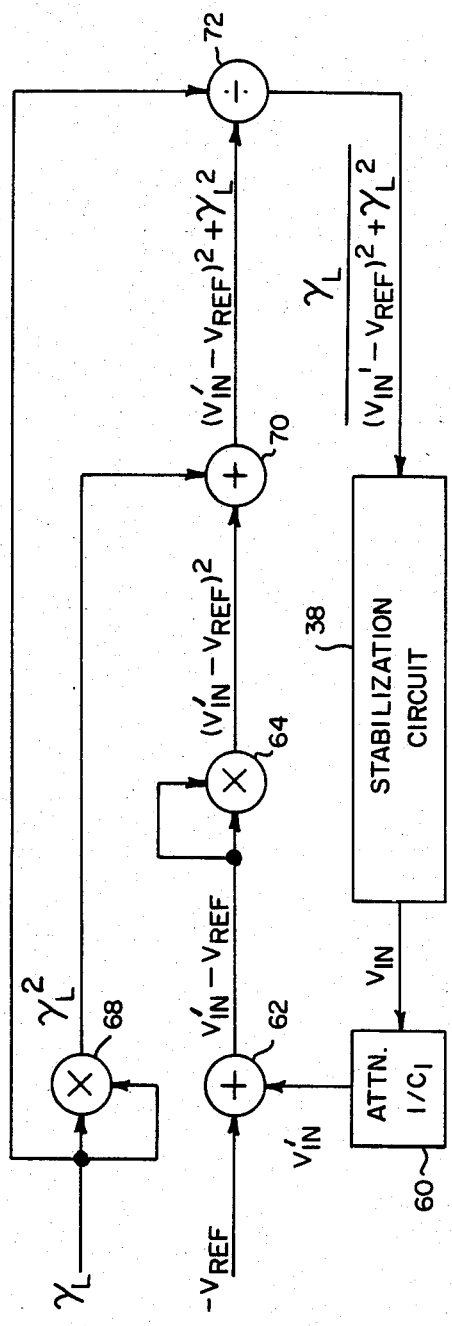
FIG. 5 illustrates an analog computing means for generating the transfer function of the actual load for the stabilization feedback loop of FIG. 1 to test the operation of that feedback loop.

Referring now to FIG. 5, an analog simulator for a $CO_2$ cw laser is disclosed for use as a test load in the development of the stabilization circuit 38, or to simulate any actual load that exhibits a Lorentzian transfer function, for example.

For the Lorentzian line transfer function $\sigma_L(\nu)$ given by equation (11), the output voltage is $$V_{OUT} \propto \frac{\gamma_L}{(V_{IN} - V_{REF})^2 + \gamma_L^2} \quad (12)$$

The three inputs to this analog circuit shown in FIG. 5 are: $V_{IN}$, the output voltage of the closed-loop stabilization circuit; $V_{REF}$, the center voltage of the Lorentzian transfer function, an adjustable parameter; and $\gamma_L$, an adjustable voltage parameter which defines the width of the spectrophone absorption line. The output voltage, $V_{OUT}$, of the analog circuit is directed to the input of the stabilization circuit 38, which has the value $A_1S/A_2P_L$ in the actual load, as shown in FIG. 1.

The analog circuit shown in FIG. 5 is comprised of an attenuator 60, which brings the input voltage level into the range of an adder 62 where a reference voltage, $-V_{REF}$, is added to the attenuated input, $V'_{IN}$, to form a difference signal $V'_{IN} - V_{REF}$. This added reference voltage is adjusted to center the lineshape (the curve of graph A in FIG. 2). The output of the adder 62 is then squared by a multiplier 64 and added with the output of a multiplier 68 which squares the parameter $\gamma_L$ that is adjusted for the desired transfer function width. The squared signal, $\gamma_L^2$, is added with the difference signal $(V'_{IN} - V_{REF})$ in an adder 70. An output divider 72 then forms the output signal, $V_{OUT}$. The analog signal thus functions in acordance with equation (12) for a voltage input, $V_{IN}$, from a stabilization circuit under test of the form $$V_{IN} = B_1 + A \sin \omega t + A_3 \int E(t) dt \quad (13)$$

Note in the example of FIG. 1 that indeed only two voltages, $V_{IN}$ and $V_{OUT}$, connect the stabilization circuit to the actual load to be simulated. Consequently, it can be readily appreciated that the present invention can be applied to simulate any load in a closed loop having a stabilization circuit that receives a feedback signal and generates an output control signal for the load. As noted hereinbefore, the advantage of thus simulating a load is that the stabilization circuit can be tested in the closed loop circuit without concern about the load itself having faults.

Other laser configurations possible with the stabilization circuit 38 of FIG. 1 that can be simulated by implementation of transfer functions include tuning the laser frequency by monitoring power transmitted through a gas cell. In either configuration (using a spectrophone or a gas cell) Stark electrodes can be provided on the monitoring device, and, instead of applying a modulation (dither) signal to the PZT voltage being corrected, it can be applied to the Stark voltage. Still another laser configuration for tuning frequency consists of monitoring reflection of the laser beam from a second optical resonator. Then either the laser PZT voltage or the resonator PZT voltage can be corrected and dithered, or else the laser PZT can be dithered while the resonator PZT is corrected, or vice versa. Yet another tuned laser configuration has already been referred to, namely tuning the laser frequency by monitoring voltage drop across the laser discharge (optogalvanic effect). In each case, the transfer function of the actual load is analyzed and then simulated, either in an analog circuit as for the example shown in FIG. 5 for the actual load 12 in FIG. 1, or in a digital circuit shown in FIG. 6.

Figure 6:
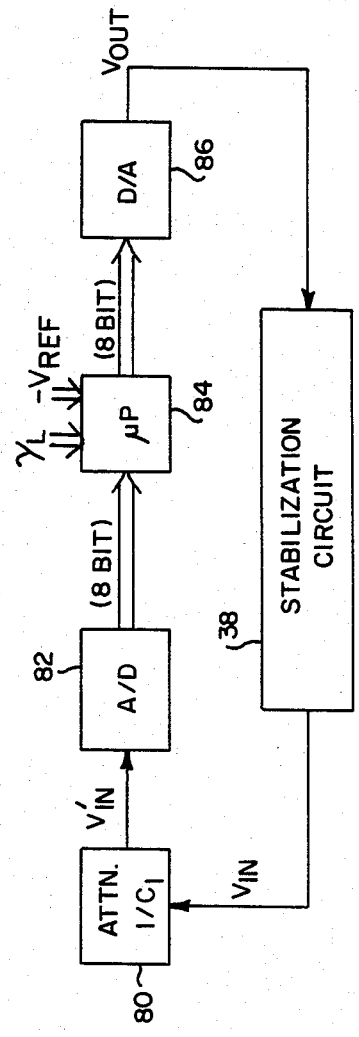
FIG. 6 illustrates a digital computing means for generating the transfer function of the actual load for the stabilization feedback loop of FIG. 1.

Referring now to FIG. 6, the input voltage, $V_{IN}$, to the digital load simulator is first attenuated, as before, in a suitable analog attenuator 80 to bring the voltage within the range of operation of an analog-to-digital converter 82. Assuming a conversion to an eight bit binary number, the analog input signal may be digitized with a sensitivity of one part in $2^8$. Using equation (12) to compute $V_{OUT}$, the voltage output of the simulated load for predetermined parameters $V_{REF}$ and $\gamma_L$, there is a unique value determined for each of $2^8$ levels of $V_{IN}$.

The computation could be carried out on line using a programmed microprocessor 84, but the computation cycle may require too much time for the desired frequency response of the closed loop. Consequently, the preferred implementation of the digital computation means would be to precompute each of the $2^8$ values of $E_{OUT}$ and store the values in a look-up table. For each value of $V_{IN}$ (attenuated as shown), there is thus a unique value immediately available for the output. This digital output is then converted to analog form by a digital-to-analog converter 86. This digital approach to simulation of the load has an advantage over the analog approach in that the load transfer function may be readily changed by simply changing the stored table. Thus a digital implementation provides a more flexible embodiment of the invention. It is universally applicable to testing any system for which the transfer function look-up table can be computed and entered into the table.

In summary, there has been disclosed, with reference to a specific example, a method and apparatus for electronic simulation of a particular load in a closed loop characterized by predictable mathematical transfer functions. It is these functions, each of which may have its own set of parameters (Lorentzian, Doppler, Voigt, Airy, and the like), that the electronic computing means simulates, thereby providing a predictable load for testing a complex loop stabilization circuit which interacts with the load in the closed loop system. This technique is particularly useful in testing a circuit for stabilizing a load in a closed loop, such as a tuned laser, but may also be used for testing an actual load having a fault. For that purpose, one or more parameters of the load simulator are adjusted to match the fault of the actual load. In that way the fault of the actual load may be analyzed to determine what is required to correct it.

Although particular embodiments of the invention have been described and illustrated herein, it is recognized that variations and equivalents may readily occur to those skilled in the art. Consequently, it is intended that the claims be interpreted to cover such variations and equivalents.

TABLE 1

| | APPENDIX A | |
|---|---|---|
| | The Lorentzian Lineshape | |
| Symbol | Function | Maxima |
| Lorentzian Lineshape | | |
| $\sigma_L(\nu)$ | $\dfrac{S}{\pi} \dfrac{\gamma_L}{(\nu - \nu_0)^2 + \gamma_L^2}$ | $\dfrac{S}{\pi\gamma_L}$ at $(\nu - \nu_0) = 0$ |
| First Derivative | | |
| $\dfrac{d}{d\nu}\sigma_L(\nu)$ | $\dfrac{-2(\nu - \nu_0)}{[(\nu - \nu_0)^2 + \gamma_L^2]}\sigma_L(\nu)$ | $\dfrac{\pm 9S}{B\sqrt{3}\,\pi\gamma_L^2}$ at $(\nu - \nu_0) = \pm \dfrac{\gamma_L}{\sqrt{3}}$ |
| Second Derivative | | $\dfrac{-2S}{\pi\gamma_L^3}$ at $(\nu - \nu_0) = 0$ |
| $\dfrac{d^2}{d\nu^2}\sigma_L(\nu)$ | $\dfrac{2[3(\nu - \nu_0)^2 - \gamma_L^2]}{[(\nu - \nu_0)^2 + \gamma_L^2]^2}\sigma_L(\nu)$ | $\dfrac{S}{2\pi\gamma_L^3}$ at $(\nu - \nu_0) = \pm\gamma_L$ |
| Third Derivative | | |
| $\dfrac{d^3}{d\nu^3}\sigma_L(\nu)$ | $\dfrac{24(\nu - \nu_0)[\gamma_L^2 - (\nu - \nu_0)^2]}{[(\nu - \nu_0)^2 + \gamma_L^2]^3}\sigma_L(\nu)$ | - |

What is claimed is:

1. A method for testing the operation of a stabilization circuit in a closed-loop system, where the stabilization circuit is designed to interact with an actual load in response to an output signal, $V_{OUT}$, by generating a control signal, $V_{IN}$, from said output signal in accordance with the transfer function of said actual load, comprising the steps of determining the transfer function of said actual load, programming computing means to implement said transfer function, utilizing said programmed computing means in place of said actual load in said closed loop, and testing the operation of said stabilization circuit in said closed loop, thus determining the operation of the stabilization circuit in a closed loop system free of any faults that may be present in said actual load to be stabilized.

2. A method as defined in claim 1 for analyzing a fault in an actual load wherein said transfer function implemented by said computing means includes at least one parameter, said method including the step of adjusting said parameter in said computing means to alter the characteristics of said load in order to emulate a faulty operation of said closed-loop system with an actual load having a fault, thereby to determine the nature of said fault.

3. Apparatus for testing the operation of a stabilization circuit having frequency stabilizing parameters in a closed-loop system for stabilizing a load, where said stabilization circuit interacts with an actual load in response to an actual load output signal, $V_{OUT}$, to provide a feedback signal, $V_{IN}$, comprising a load simulating signal generating means adapted to be substituted for said load and supplied with said feedback signal and at least one load parameter, and operative to transmit an output signal, $V_{OUT}$, as a function of said feedback signal and load parameter for simulating said actual load, and means for adjusting said load parameter.

4. Apparatus as defined in claim 3 wherein said load simulating signal generating means is comprised of an analog computing means responsive to said feedback signal and load parameter.

5. Apparatus as defined in claim 3 wherein said load simulating signal generating means is comprised of an analog-to-digital converter for periodically sampling said feedback signal and converting it to digital form, digital computing means responsive to said feedback signal in digital form for computing said output signal in digital form as a function of said parameter, and digital-to-analog converting means for converting to analog form each output signal value computed in digital form.

6. Apparatus as defined in claim 5 wherein said digital computing means is comprised of a look-up table in which precomputed values of said output signal are stored.

7. Apparatus as defined in claim 3 wherein said actual load is comprised of a spectrophone stabilized laser having a Lorentzian absorption line response, and said computing means computes said output signal in accordance with the equation $$V_{OUT} \propto \frac{\gamma_L}{(V_{IN} - V_{REF})^2 + \gamma_L^2}$$

where $\gamma_L$ is a parameter which defines the width of the spectrophone absorption line and $V_{REF}$ is the center voltage of the Lorentzian transfer function of said spectrophone stabilized laser.

* * * * *